United States Patent
Arrington et al.

(10) Patent No.: US 11,679,407 B2
(45) Date of Patent: Jun. 20, 2023

(54) LIQUID METAL THERMAL INTERFACE MATERIAL APPLICATION

(71) Applicant: Intel Corporation, Santa Clara, CA (US)

(72) Inventors: Kyle Jordan Arrington, Gilbert, AZ (US); Joseph Blaine Petrini, Gilbert, AZ (US); Aaron McCann, Chandler, AZ (US); Shankar Devasenathipathy, Tempe, AZ (US); James Christopher Matayabas, Jr., Gilbert, AZ (US); Mostafa Aghazadeh, Chandler, AZ (US); Jerrod Peterson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 73 days.

(21) Appl. No.: 16/913,986

(22) Filed: Jun. 26, 2020

(65) Prior Publication Data

US 2021/0101175 A1    Apr. 8, 2021

(51) Int. Cl.
*B05C 1/02* (2006.01)
*B05C 1/00* (2006.01)
(Continued)

(52) U.S. Cl.
CPC ............ *B05C 1/02* (2013.01); *B05C 1/00* (2013.01); *C23C 28/00* (2013.01); *B05D 1/28* (2013.01); *H05K 7/2039* (2013.01)

(58) Field of Classification Search
CPC .. B05C 1/00; B05C 1/02; B05C 1/027; B05C 21/00; H01L 21/4871; H01L 23/42;
(Continued)

(56) References Cited

U.S. PATENT DOCUMENTS 4,605,569 A * 8/1986 Shimada ............... B05C 5/0216
  901/41
4,660,501 A * 4/1987 Nagata ..................... B05C 9/08
  118/240
(Continued)

FOREIGN PATENT DOCUMENTS

CN    105562294    * 5/2016    ............. B05C 13/02
JP     61178965    * 11/1986

OTHER PUBLICATIONS

English Translation of Specification of Nagata, JP61178965U, published Nov. 8, 1986. (Year: 1986).*

*Primary Examiner* — Laura Edwards
(74) *Attorney, Agent, or Firm* — Schwegman Lundberg & Woessner, P.A.

(57) ABSTRACT

To address technical problems facing silicon transient thermal management, a thermal interface material (TIM) may be used to provide improved thermal conduction. The TIM may include a liquid metal (LM) TIM, which may provide a significant reduction in thermal resistance, such as a thermal resistance $R_{TIM} \approx 0.01 - 0.025°$ C.-cm2/W. The LM TIM may be applied using a presoaked applicator, such as an open-cell polyurethane foam applicator that has been presoaked in a controlled amount of LM TIM. This LM presoaked applicator is then used to apply the LM TIM to one or more target thermal surfaces, thereby providing thermal and mechanical coupling between the LM TIM and the thermal surface. The resulting thermal surface and thermally conductive LM TIM may be used to improve thermal conduction for various silicon-based devices, including various high-power, high-performance system-on-chip (SoC) packages, such as may be used in portable consumer products.

9 Claims, 7 Drawing Sheets

(51) Int. Cl.
*C23C 28/00* (2006.01)
*H05K 7/20* (2006.01)
*B05D 1/28* (2006.01)

(58) Field of Classification Search
CPC .... H05K 7/2039; C23C 28/34; C23C 28/345; C23C 28/00
USPC .................... 118/688, 712, 264, 265; 901/43
See application file for complete search history.

(56) References Cited

U.S. PATENT DOCUMENTS 4,790,259 A * 12/1988 Morris ................. B25J 17/0208
   118/707
5,891,521 A *  4/1999 Marumoto ................ B05C 1/02
   427/284

* cited by examiner

LIQUID METAL THERMAL INTERFACE MATERIAL APPLICATION

TECHNICAL FIELD

Embodiments described herein generally relate to application of liquid metal.

BACKGROUND

Advancements in silicon performance require increased power density and improved thermal management. To address this, various external thermal solution components may be used, such as a fan or heat exchanger (e.g., heat sink). However, these solutions are too remote from the heat source to provide sufficient thermal management, particularly during transient thermal events. What is needed is an improved solution for silicon transient thermal management.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

To address technical problems facing silicon transient thermal management, a thermal interface material (TIM) may be used to provide improved thermal conduction. The TIM may include a liquid metal (LM) TIM, which may provide a significant reduction in thermal resistance, such as a thermal resistance $R_{TIM}$ 0.01-0.025° C.-cm2/W. The LM TIM may be applied using a presoaked applicator, such as an open-cell polyurethane foam applicator that has been presoaked in a controlled amount of LM TIM. This LM presoaked applicator is then used to apply the LM TIM to one or more target thermal surfaces, thereby providing thermal and mechanical coupling between the LM TIM and the thermal surface. The resulting thermal surface and thermally conductive LM TIM may be used to improve thermal conduction for various silicon-based devices, including various high-power, high-performance system-on-chip (SoC) packages, such as may be used in portable consumer products.

Figure 1:
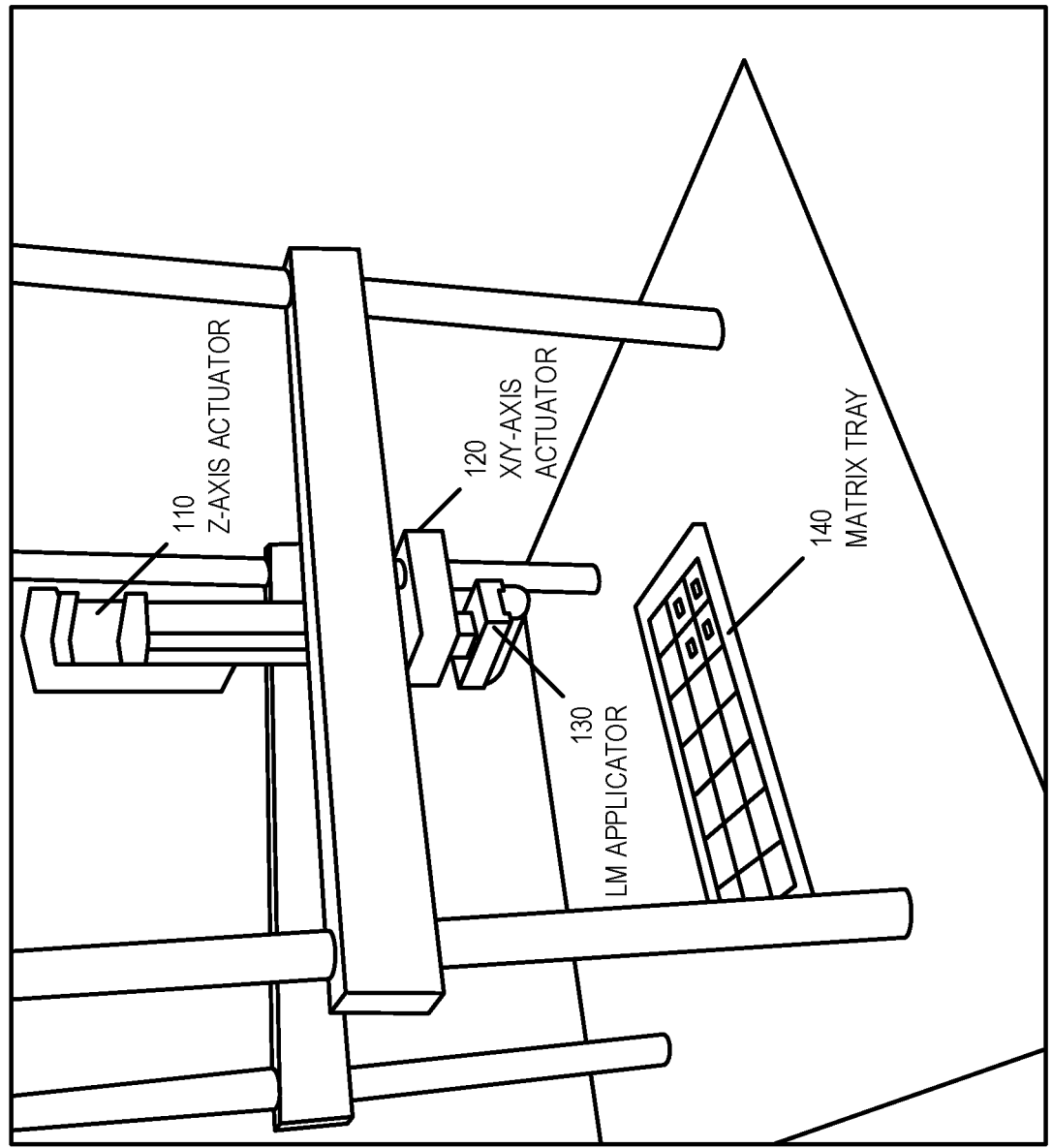
FIG. 1 is a block diagram of an example LM TIM application system, according to an embodiment.

FIG. 1 is a block diagram of an example LM TIM application system 100, according to an embodiment. System 100 may include one or more actuators, such as a Z-axis actuator 110 and an X/Y-axis actuator 120. The actuators may be used to move an LM applicator 130, such as to apply the LM TIM to an upper thermal surface of one or more silicon packages or other thermally limited devices (e.g., CPU, GPU, SOC). In an example, silicon packages may be disposed within a matrix tray 140, such as within a silicon package matrix tray (e.g., Joint Electron Device Engineering Council (JEDEC) tray). In another example, silicon packages or other thermally limited surface-mounted technology (SMT) components may be mounted on a motherboard, and multiple motherboards may be disposed within a motherboard matrix tray. The Z-axis actuator 110 and the X/Y-axis actuator 120 may be used to move the LM applicator 130 to multiple silicon packages or other thermally limited devices, such as shown in FIG. 2.

Figure 2:
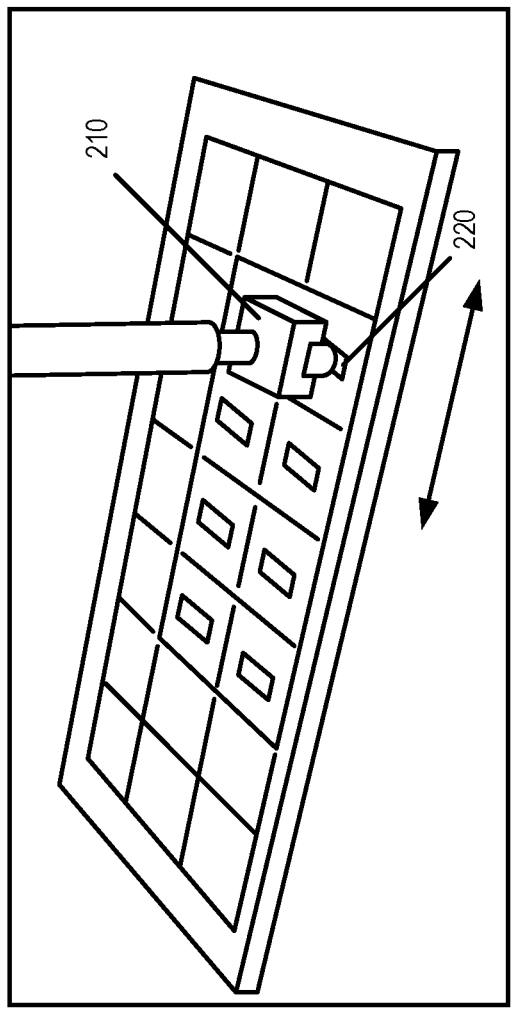
FIG. 2 is a block diagram of an example LM TIM application motion, according to an embodiment.
Figure 2:
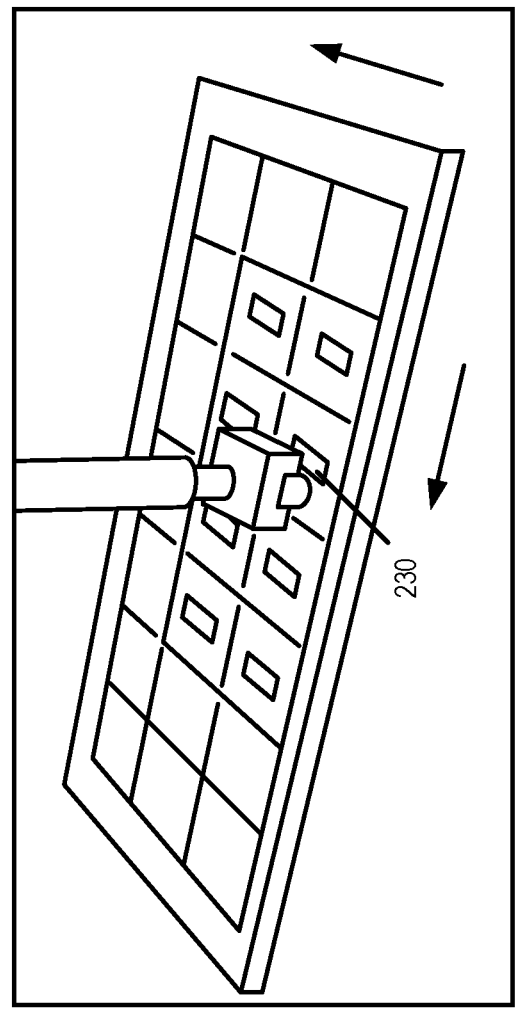

FIG. 2 is a block diagram of an example LM TIM application motion 200, according to an embodiment. In the LM TIM application motion 200, a Z-axis actuator may be used to cause the LM applicator 210 to contact and be compressed against a thermal surface 220. An X/Y-axis actuator may be used to scrub (e.g., swipe) the LM applicator 210 back and forth across the thermal surface 220. The scrubbing motion may be used to apply the LM TIM to the entire target surface while repeatably controlling the volume of LM applied. Once the LM TIM is applied to the thermal surface 220, the Z-axis actuator may be used to lift the LM applicator 210 away from the thermal surface, and the X/Y-axis actuator may be used to reposition the LM applicator 210 to another thermal surface 230. The repositioning of the LM applicator 210 and application of LM TIM to each of multiple thermal surfaces provides improved efficiency of LM TIM application, particularly when compared to stencil configurations that apply LM TIM to stencils that are subsequently cleaned or discarded.

Various combinations of actuators may be used to position and move the LM applicator 130. In various examples, a multi-axis actuator may provide motion in multiple axes, separate linear actuators may be used for each axis, a robotic arm with rotational actuators (e.g., servos) may be used to provide relative or absolute positioning, or other combinations of linear, rotational, or other actuators. The motion and geometry of the LM applicator 210 may improve the ability of the LM applicator 210 to overcome LM surface tension and lift away from the thermal surface, such as using the assembly shown in FIG. 3.

Figure 3:
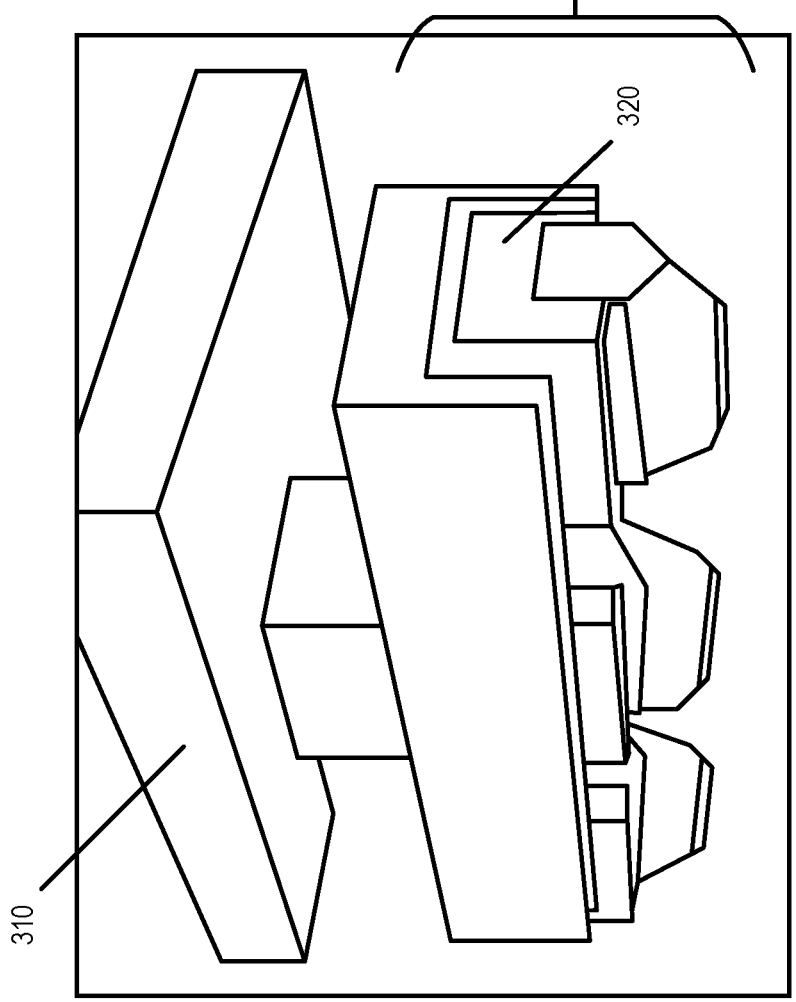
FIG. 3 is a block diagram of an example LM TIM applicator assembly, according to an embodiment.

FIG. 3 is a block diagram of an example LM TIM applicator assembly 300, according to an embodiment. The applicator assembly 300 may include an applicator mount 310, which may be used to secure an actuator arm to one or more LM applicators 320. The applicator mount 310 may include sockets and fasteners to secure multiple LM applicators 320, which may be used to apply LM TIM simultaneously to multiple thermal surfaces. The LM applicator geometry, LM applicator porosity, and the multi-step motion provides improved application of the LM TIM to the thermal surface and reliability of the separation of the LM applicator from the thermal surface, as described below.

The LM applicator geometry may be selected to provide this improved LM TIM application and separation of the LM applicator. The LM applicator geometry may include a tapered sponge geometry (e.g., wedge-shaped geometry), which may include one or more tapered surfaces 330. The high surface tension of LM TIM causes the thermal surface to adhere to the applicator. The tapered surface 330 may be designed to contact only a portion of a thermal surface to reduce the adhesion between the LM applicator and thermal surface, especially when contrasted with an LM full-surface stamp or other larger LM TIM surface.

The LM applicator porosity may be selected to provide the improved LM TIM application and separation of the LM applicator. The LM applicator 320 may include a sponge selected to provide improved LM TIM absorption, retention, and deposition. The sponge may include an open-cell polymeric foam such as an open-cell polyurethane foam. In an example, the LM applicator 320 submerges at least a portion of the foam within a container of LM TIM, and the LM TIM is absorbed into and retained within the open-cell foam. In another example, the LM applicator 320 includes an LM TIM container (e.g., injector), where the LM TIM container is partially or completely embedded within the LM applicator. The LM TIM container may be used to apply the LM TIM into the open-cell foam, such as using a positive pressure LM TIM system, and the LM TIM surface tension and the porosity of the open-cell foam may promote the absorption and diffusion of the LM TIM into the open-cell foam. This combination of LM applicator porosity and geometry provides improved precision and reliability in the application of the high surface tension LM TIM, especially when contrasted with direct application (e.g., extruding, pouring) of an LM TIM onto a thermal surface and subsequently attempting to distribute the applied LM TIM.

Figure 4:
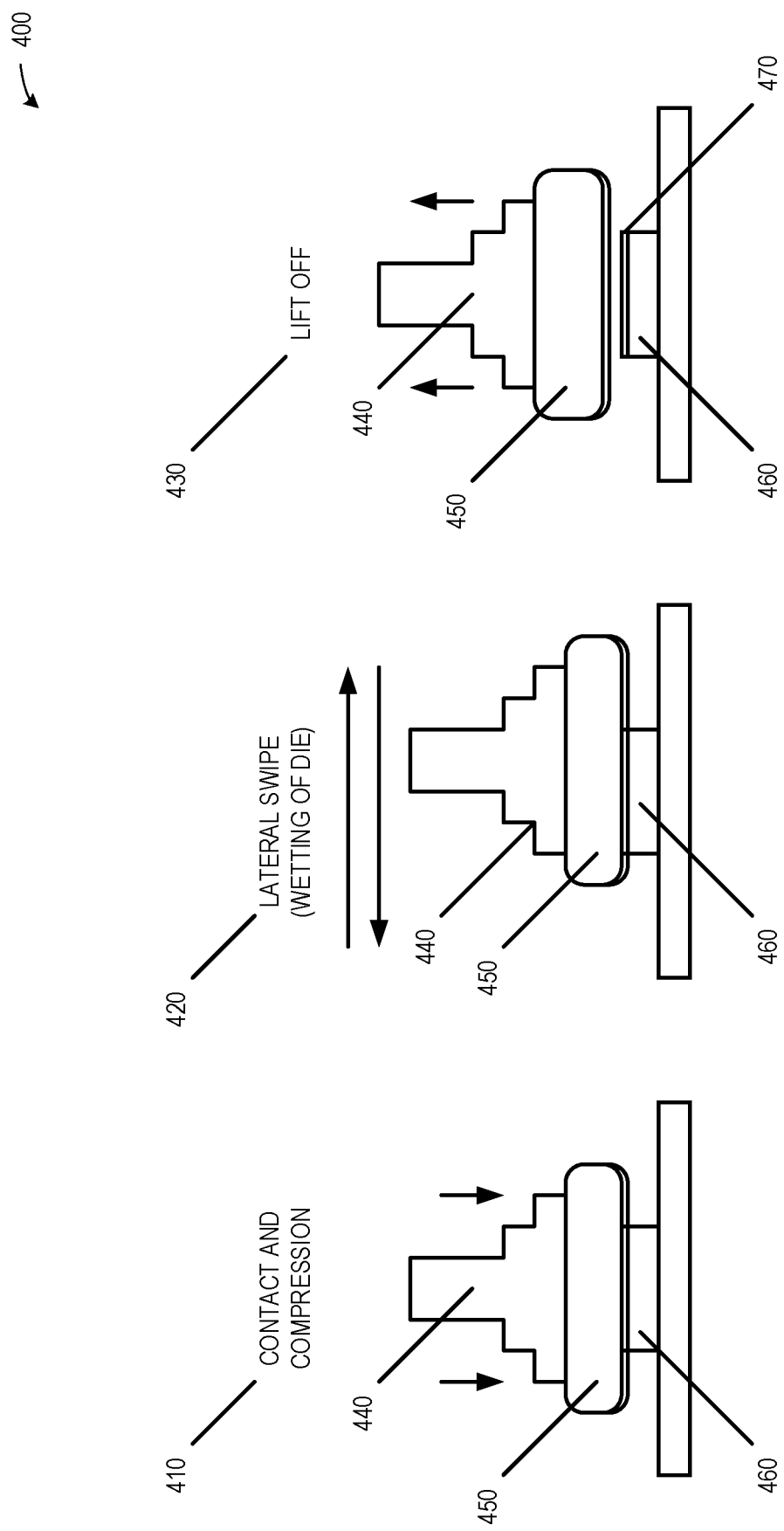
FIG. 4 is a block diagram of an example LM TIM application multi-step motion, according to an embodiment.

FIG. 4 is a block diagram of an example LM TIM application multi-step motion 400, according to an embodiment. The multi-step motion 400 provides improved application of the LM TIM to the thermal surface and reliability of the separation of the LM applicator from the thermal surface. The multi-step motion 400 includes compressing 410 an LM applicator 440 and a sponge 450 onto a thermal surface 460. The sponge 450 may include an open-cell polymeric foam that has been presoaked with the LM TIM. The multi-step motion 400 includes scrubbing 420 the sponge 450 parallel to the thermal surface 460. This scrubbing 420 may be used to deposit multiple layers of LM TIM onto the thermal surface 460. In an example, the LM TIM includes a gallium based LM, and the scrubbing 420 deposits gallium oxide on the thermal surface 460, where the gallium oxide provides improved anchoring of the LM. The multi-step motion 400 includes lifting 430 the sponge 450 away from the thermal surface 460, leaving a uniform LM TIM coating 470 on the thermal surface 460.

The multi-step motion 400 and resulting LM TIM coating 470 may provide features that may be used to detect infringement. In an example, the multi-step motion 400 may leave brush strokes or other detectable directional artifacts in one or more layers of the LM TIM coating 470. In another example, the LM TIM may include a gallium based LM, and chemical or visual examination may identify the initial gallium oxide layer deposited by the scrubbing 420. This infringement detection analysis may also be performed by examining a manufacturing line to identify one or more of the multi-step motion 400, the LM applicator 440, the sponge 450, or other features described herein.

Figure 5:
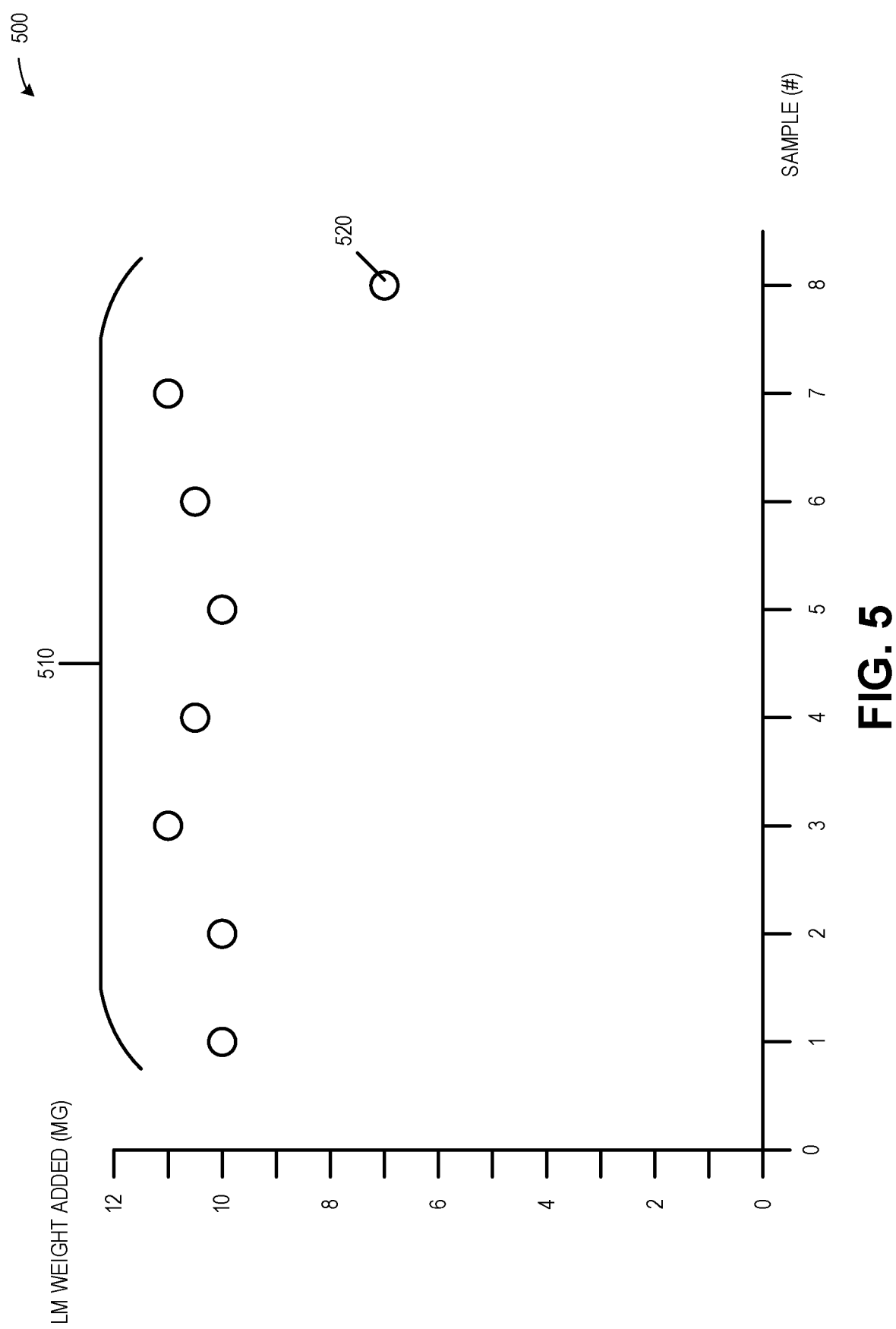
FIG. 5 is an LM dispense weight graph, according to an embodiment.

FIG. 5 is an LM dispense weight graph 500, according to an embodiment. Graph 500 shows eight separate measurements 510 of LM weight dispensed on a thermal surface. The measurements 510 may be used to determine various features of the LM application, such as pressure to be applied to the thermal surface, stroke length of the Z-axis motor, number of scrubbing passes, how often to replenish the LM TIM within an LM applicator, and other LM application features. In an example, a target LM dispense weight may be selected based on a desired thermal conductivity and the thermal surface geometry, and this target LM dispense weight may be controlled by selecting a predetermined LM applicator pressure and stroke length of the Z-axis motor.

The LM weight may be measured prior to or during application of the LM TIM. In an example, a series of LM weight tests may be conducted prior to manufacturing to provide a target LM dispense weight. These weight tests may be used to determine pressure to be applied to the thermal surface, stroke length of the Z-axis motor, number of scrubbing passes, and how often to replenish the applicator with LM TIM. In another example, LM weight tests may be conducted during manufacturing to improve the reliability of providing the target LM dispense weight. To conduct weight tests during manufacturing, a silicon device or matrix tray may be secured to a scale, and the scale may measure before and after each application of LM TIM. As shown in FIG. 5, the first seven of the measurements 510 are within approximately 1 mg of each other, and the eighth measurement 520 indicates a low LM dispense weight. In response to detecting the low LM dispense weight, the LM applicator may be controlled to apply one or more additional LM layers, such as using a higher application position (e.g., minor reduction in stroke length of the Z-axis motor) to apply the additional LM layers onto the existing LM layers. The detection of a low LM dispense weight may also trigger a replenishing of LM TIM within the LM applicator, such as by injecting additional LM TIM into LM applicator.

Figure 6:
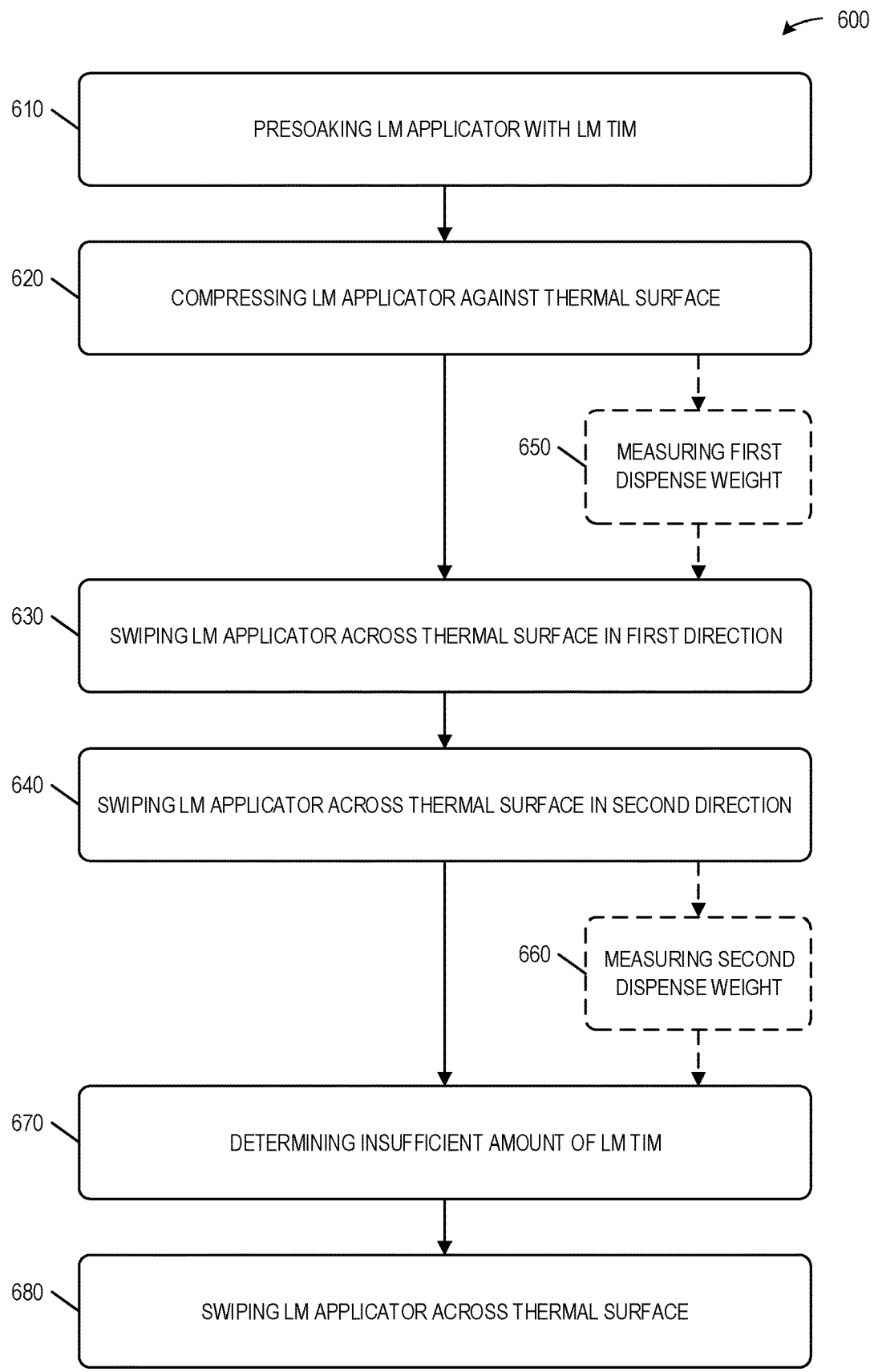
FIG. 6 is an example of a method for network function execution, according to an embodiment.

FIG. 6 is an example of a method 600 for network function execution, according to an embodiment. The operations of the method 600 are implemented in computing hardware, such as that described above in FIGS. 1-5, or below in FIG. 7 (e.g., processing circuitry).

Method 600 may include presoaking 610 a liquid metal (LM) applicator with an LM thermal interface material (TIM). The LM applicator may include an open-cell polyurethane foam applicator to retain the LM TIM. Presoaking of the LM applicator may include submerging at least a portion of the LM applicator in the LM TIM. In another example, presoaking of the LM applicator may include applying a predetermined amount of the LM TIM to the LM applicator. This application of the predetermined amount of the LM TIM may include releasing the predetermined amount of the LM TIM from an LM TIM container, where the LM TIM container may be at least partially embedded within the LM applicator.

Method 600 may include compressing 620 the LM applicator against a thermal surface. Method 600 may include swiping 630 the LM applicator across the thermal surface in a first direction to deposit a first LM layer onto the thermal surface. Method 600 may include swiping 640 the LM applicator across the thermal surface in a second direction to deposit a second LM layer onto the first LM layer.

The LM TIM may include an oxide. The deposition of the first LM layer onto the thermal surface may include forming an oxide layer on the thermal surface to anchor the LM TIM to the thermal surface, and the second LM layer bonds to the oxide layer. The LM TIM may include a gallium based LM, and the oxide layer may include gallium oxide.

The LM applicator may include an LM application region to contact the thermal surface to deposit the first LM layer onto the thermal surface. The LM application region may be smaller than the thermal surface to reduce surface tension between the thermal surface and the LM TIM in the LM applicator. The reduced surface tension may improve the ability of the LM applicator to be lifted from the thermal surface.

Method 600 may include measuring 650 a first dispense weight prior to the deposition of the LM first layer. Method 600 may include measuring 660 a second dispense weight subsequent to the deposition of the second layer of the LM. Method 600 may include determining 670 that an insufficient amount of LM TIM has been applied. The determination 670 may be based on the first dispense weight and the second dispense weight. Method 600 may include swiping 680 the LM applicator across the thermal surface to deposit a third LM layer onto the second LM layer.

Figure 7:
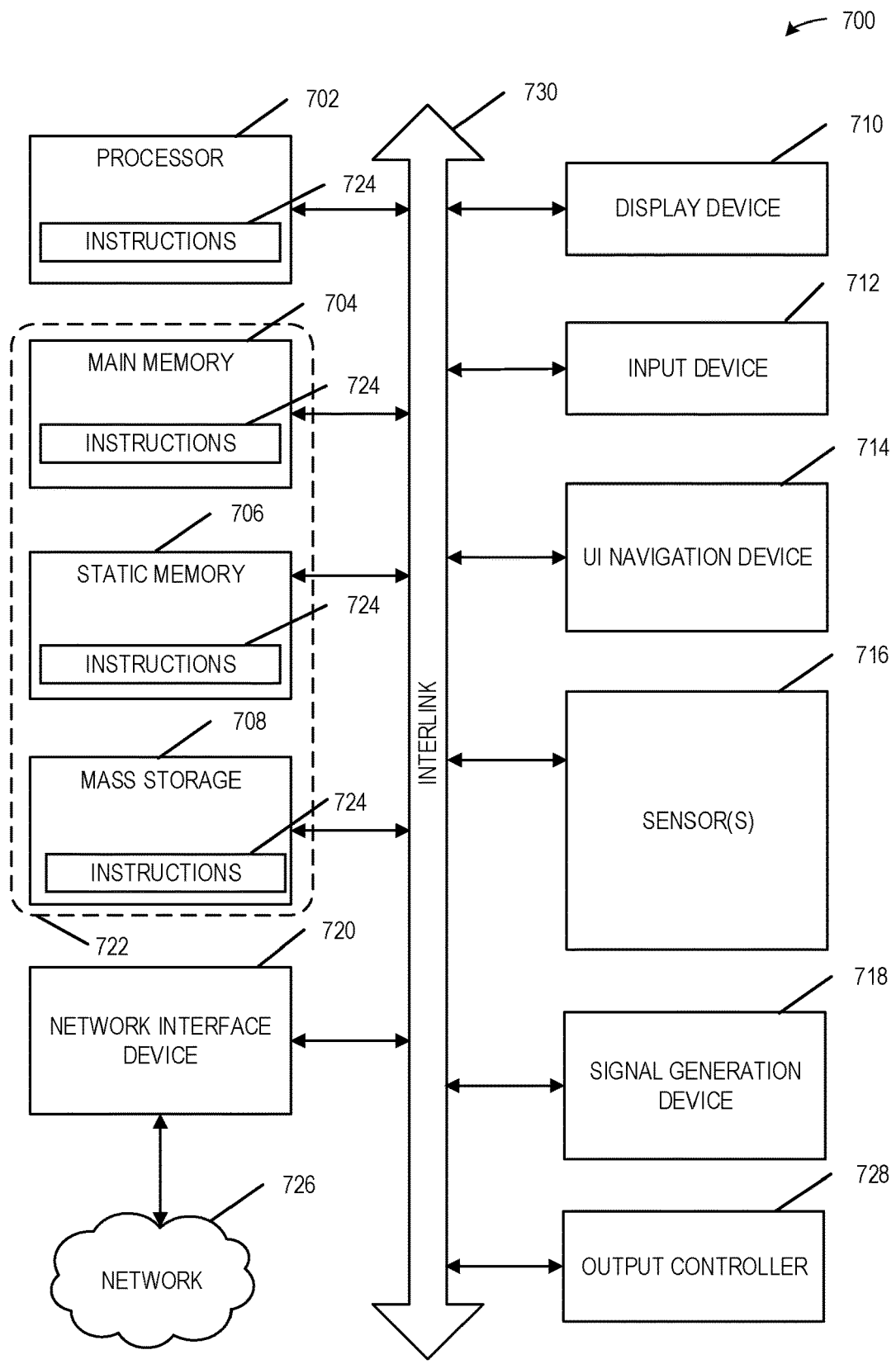
FIG. 7 illustrates a block diagram of an example machine upon which any one or more of the techniques (e.g., methodologies) discussed herein may perform.

FIG. 7 illustrates a block diagram of an example machine 700 upon which any one or more of the techniques (e.g., methodologies) discussed herein may perform. Machine 700 may be used to perform the operations described herein or to control industrial manufacturing equipment to perform the operations described herein. Examples, as described herein, may include, or may operate by, logic or a number of components, or mechanisms in the machine 700. Circuitry (e.g., processing circuitry) is a collection of circuits implemented in tangible entities of the machine 700 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 700 follow.

In alternative embodiments, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in peer-to-peer (P2P) (or other distributed) network environment. The machine 700 may be a personal computer (PC), a tablet PC, a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 700 may include a hardware processor 702 (e.g., a central processing unit (CPU), a graphics processing unit (GPU), a hardware processor core, or any combination thereof), a main memory 704, a static memory (e.g., memory or storage for firmware, microcode, a basic-input-output (BIOS), unified extensible firmware interface (UEFI), etc.) 706, and mass storage 708 (e.g., hard drive, tape drive, flash storage, or other block devices) some or all of which may communicate with each other via an interlink (e.g., bus) 730. The machine 700 may further include a display unit 710, an alphanumeric input device 712 (e.g., a keyboard), and a user interface (UI) navigation device 714 (e.g., a mouse). In an example, the display unit 710, input device 712 and UI navigation device 714 may be a touch screen display. The machine 700 may additionally include a storage device (e.g., drive unit) 708, a signal generation device 718 (e.g., a speaker), a network interface device 720, and one or more sensors 716, such as a global positioning system (GPS) sensor, compass, accelerometer, or other sensor. The machine 700 may include an output controller 728, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 702, the main memory 704, the static memory 706, or the mass storage 708 may be, or include, a machine readable medium 722 on which is stored one or more sets of data structures or instructions 724 (e.g., software) embodying or utilized by any one or more of the techniques or functions described herein. The instructions 724 may also reside, completely or at least partially, within any of registers of the processor 702, the main memory 704, the static memory 706, or the mass storage 708 during execution thereof by the machine 700. In an example, one or any combination of the hardware processor 702, the main memory 704, the static memory 706, or the mass storage 708 may constitute the machine readable media 722. While the machine readable medium 722 is illustrated as a single medium, the term "machine readable medium" may include a single medium or multiple media (e.g., a centralized or distributed database, and/or associated caches and servers) configured to store the one or more instructions 724.

The term "machine readable medium" may include any medium that is capable of storing, encoding, or carrying instructions for execution by the machine 700 and that cause the machine 700 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 724 may be further transmitted or received over a communications network 726 using a transmission medium via the network interface device 720 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 720 may include one or more physical jacks (e.g., Ethernet, coaxial, or phone jacks) or one or more antennas to connect to the communications network 726. In an example, the network interface device 720 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 700, and includes digital or analog communications signals or other intangible medium to facilitate communication of such software. A transmission medium is a machine readable medium.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

Example 1 is a liquid metal thermal interface material application system comprising: a liquid metal (LM) applicator presoaked with an LM thermal interface material (TIM); an applicator mount to retain a portion of the LM applicator; an actuator attached to the applicator mount, the actuator to: compress the LM applicator against a thermal surface; swipe the LM applicator across the thermal surface in a first direction to deposit a first LM layer onto the thermal surface; and swipe the LM applicator across the thermal surface in a second direction to deposit a second LM layer onto the first LM layer.

In Example 2, the subject matter of Example 1 optionally includes the system further including: a memory; and processing circuitry to control the actuator to: compress the LM applicator against the thermal surface; swipe the LM applicator across the thermal surface in the first direction; and swipe the LM applicator across the thermal surface in the second direction.

In Example 3, the subject matter of Example 2 optionally includes wherein the actuator includes: a first single axis actuator to compress the LM applicator in a first axis; and a second single axis actuator to swipe the LM applicator in a second axis perpendicular to the first axis, the second axis including the first direction and the second direction.

In Example 4, the subject matter of any one or more of Examples 2-3 optionally include wherein: the actuator includes a third single axis actuator to reposition the LM applicator in a third axis from a first position above the thermal surface to a second position above a second thermal surface; and the third axis is orthogonal to the first axis and to the second axis.

In Example 5, the subject matter of any one or more of Examples 2-4 optionally include wherein: the LM applicator includes an LM application region to contact the thermal surface to deposit the first LM layer onto the thermal surface; and the LM application region is smaller than the thermal surface to reduce surface tension between the thermal surface and the LM TIM in the LM applicator, the reduced surface tension to improve the ability of the LM applicator to be lifted from the thermal surface.

In Example 6, the subject matter of Example 5 optionally includes wherein the LM applicator includes an open-cell polyurethane foam applicator.

In Example 7, the subject matter of any one or more of Examples 2-6 optionally include wherein: the LM TIM includes an oxide; the deposition of the first LM layer onto the thermal surface includes forming an oxide layer on the thermal surface to anchor the LM TIM to the thermal surface; and the second LM layer bonds to the oxide layer.

In Example 8, the subject matter of Example 7 optionally includes wherein: the LM TIM includes a gallium based LM; and the oxide layer includes gallium oxide.

In Example 9, the subject matter of any one or more of Examples 2-8 optionally include wherein the presoaking of the LM applicator includes submerging at least a portion of the LM applicator in the LM TIM.

In Example 10, the subject matter of any one or more of Examples 2-9 optionally include wherein the presoaking of the LM applicator includes applying a predetermined amount of the LM TIM to the LM applicator.

In Example 11, the subject matter of any one or more of Examples 9-10 optionally include wherein the application of the predetermined amount of the LM TIM includes releasing the predetermined amount of the LM TIM from an LM TIM container, the LM TIM container supported by the applicator mount and at least partially embedded within the LM applicator.

In Example 12, the subject matter of any one or more of Examples 2-11 optionally include a measurement device to: measure a first dispense weight prior to the deposition of the LM first layer; measure a second dispense weight subsequent to the deposition of the second layer of the LM; wherein the processing circuitry is further to: determine, based on the first dispense weight and the second dispense weight; that an insufficient amount of LM TIM has been applied; and cause the actuator to swipe the LM applicator across the thermal surface to deposit a third LM layer onto the second LM layer.

Example 13 is a liquid metal thermal interface material application method comprising: presoaking a liquid metal (LM) applicator with an LM thermal interface material (TIM); compressing the LM applicator against a thermal surface; swiping the LM applicator across the thermal surface in a first direction to deposit a first LM layer onto the thermal surface; and swiping the LM applicator across the thermal surface in a second direction to deposit a second LM layer onto the first LM layer.

In Example 14, the subject matter of Example 13 optionally includes wherein: the LM TIM includes an oxide; the deposition of the first LM layer onto the thermal surface includes forming an oxide layer on the thermal surface to anchor the LM TIM to the thermal surface; and the second LM layer bonds to the oxide layer.

In Example 15, the subject matter of Example 14 optionally includes wherein: the LM TIM includes a gallium-based LM; and the oxide layer includes gallium oxide.

In Example 16, the subject matter of any one or more of Examples 13-15 optionally include wherein: the LM applicator includes an LM application region to contact the thermal surface to deposit the first LM layer onto the thermal surface; and the LM application region is smaller than the thermal surface to reduce surface tension between the thermal surface and the LM TIM in the LM applicator, the reduced surface tension to improve the ability of the LM applicator to be lifted from the thermal surface.

In Example 17, the subject matter of Example 16 optionally includes wherein the LM applicator includes an open-cell polyurethane foam applicator.

In Example 18, the subject matter of any one or more of Examples 13-17 optionally include wherein the presoaking of the LM applicator includes submerging at least a portion of the LM applicator in the LM TIM.

In Example 19, the subject matter of any one or more of Examples 13-18 optionally include wherein the presoaking of the LM applicator includes applying a predetermined amount of the LM TIM to the LM applicator.

In Example 20, the subject matter of any one or more of Examples 18-19 optionally include wherein the application of the predetermined amount of the LM TIM includes releasing the predetermined amount of the LM TIM from an LM TIM container, the LM TIM container at least partially embedded within the LM applicator.

In Example 21, the subject matter of any one or more of Examples 13-20 optionally include measuring a first dispense weight prior to the deposition of the LM first layer; measuring a second dispense weight subsequent to the deposition of the second layer of the LM; determining, based on the first dispense weight and the second dispense weight; that an insufficient amount of LM TIM has been applied; and swiping the LM applicator across the thermal surface to deposit a third LM layer onto the second LM layer.

Example 22 is at least one machine-readable medium including instructions, which when executed by a computing system, cause the computing system to perform any of the methods of Examples 13-21.

Example 23 is an apparatus comprising means for performing any of the methods of Examples 13-21.

Example 24 is at least one non-transitory machine-readable storage medium, comprising a plurality of instructions that, responsive to being executed with processor circuitry of a computer-controlled device, cause the computer-controlled device to: presoak a liquid metal (LM) applicator with an LM thermal interface material (TIM); compress the LM applicator against a thermal surface; swipe the LM applicator across the thermal surface in a first direction to deposit a first LM layer onto the thermal surface; and swipe the LM applicator across the thermal surface in a second direction to deposit a second LM layer onto the first LM layer.

In Example 25, the subject matter of Example 24 optionally includes wherein: the LM TIM includes an oxide; the deposition of the first LM layer onto the thermal surface includes forming an oxide layer on the thermal surface to anchor the LM TIM to the thermal surface; and the second LM layer bonds to the oxide layer.

In Example 26, the subject matter of Example 25 optionally includes wherein: the LM TIM includes a gallium-based LM; and the oxide layer includes gallium oxide.

In Example 27, the subject matter of any one or more of Examples 24-26 optionally include wherein: the LM applicator includes an LM application region to contact the thermal surface to deposit the first LM layer onto the thermal surface; and the LM application region is smaller than the thermal surface to reduce surface tension between the thermal surface and the LM TIM in the LM applicator, the reduced surface tension to improve the ability of the LM applicator to be lifted from the thermal surface.

In Example 28, the subject matter of Example 27 optionally includes wherein the LM applicator includes an open-cell polyurethane foam applicator.

In Example 29, the subject matter of any one or more of Examples 24-28 optionally include wherein the presoaking of the LM applicator includes submerging at least a portion of the LM applicator in the LM TIM.

In Example 30, the subject matter of any one or more of Examples 24-29 optionally include wherein the presoaking of the LM applicator includes applying a predetermined amount of the LM TIM to the LM applicator.

In Example 31, the subject matter of any one or more of Examples 29-30 optionally include wherein the application of the predetermined amount of the LM TIM includes releasing the predetermined amount of the LM TIM from an LM TIM container, the LM TIM container at least partially embedded within the LM applicator.

In Example 32, the subject matter of any one or more of Examples 24-31 optionally include the instructions further causing the computer-controlled device to: measure a first dispense weight prior to the deposition of the LM first layer; measure a second dispense weight subsequent to the deposition of the second layer of the LM; determine, based on the first dispense weight and the second dispense weight; that an insufficient amount of LM TIM has been applied; and swipe the LM applicator across the thermal surface to deposit a third LM layer onto the second LM layer.

Example 33 is a liquid metal thermal interface material application apparatus comprising: means for presoaking a liquid metal (LM) applicator with an LM thermal interface material (TIM); means for compressing the LM applicator against a thermal surface; means for swiping the LM applicator across the thermal surface in a first direction to deposit a first LM layer onto the thermal surface; and means for swiping the LM applicator across the thermal surface in a second direction to deposit a second LM layer onto the first LM layer.

In Example 34, the subject matter of Example 33 optionally includes wherein: the LM TIM includes an oxide; the deposition of the first LM layer onto the thermal surface includes forming an oxide layer on the thermal surface to anchor the LM TIM to the thermal surface; and the second LM layer bonds to the oxide layer.

In Example 35, the subject matter of Example 34 optionally includes wherein: the LM TIM includes a gallium-based LM; and the oxide layer includes gallium oxide.

In Example 36, the subject matter of any one or more of Examples 33-35 optionally include wherein: the LM applicator includes an LM application region to contact the thermal surface to deposit the first LM layer onto the thermal surface; and the LM application region is smaller than the thermal surface to reduce surface tension between the thermal surface and the LM TIM in the LM applicator, the reduced surface tension to improve the ability of the LM applicator to be lifted from the thermal surface.

In Example 37, the subject matter of Example 36 optionally includes wherein the LM applicator includes an open-cell polyurethane foam applicator.

In Example 38, the subject matter of any one or more of Examples 33-37 optionally include wherein the presoaking of the LM applicator includes submerging at least a portion of the LM applicator in the LM TIM.

In Example 39, the subject matter of any one or more of Examples 33-38 optionally include wherein the presoaking of the LM applicator includes applying a predetermined amount of the LM TIM to the LM applicator.

In Example 40, the subject matter of any one or more of Examples 38-39 optionally include wherein the application of the predetermined amount of the LM TIM includes releasing the predetermined amount of the LM TIM from an LM TIM container, the LM TIM container at least partially embedded within the LM applicator.

In Example 41, the subject matter of any one or more of Examples 33-40 optionally include means for measuring a first dispense weight prior to the deposition of the LM first layer; means for measuring a second dispense weight subsequent to the deposition of the second layer of the LM; means for determining, based on the first dispense weight and the second dispense weight; that an insufficient amount of LM TIM has been applied; and means for swiping the LM applicator across the thermal surface to deposit a third LM layer onto the second LM layer.

Example 42 is at least one machine-readable medium including instructions, which when executed by a machine, cause the machine to perform operations of any of the operations of Examples 1-41.

Example 43 is an apparatus comprising means for performing any of the operations of Examples 1-41.

Example 44 is a system to perform the operations of any of the Examples 1-41.

Example 45 is a method to perform the operations of any of the Examples 1-41.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

What is claimed is:

1. A liquid metal thermal interface material application system comprising
    a tapered liquid metal (LM) applicator presoaked with an LM thermal interface material (TIM), the tapered LM applicator including a mounting portion and an LM application region, the tapered LM applicator including a tapered geometry in which the LM application region is smaller than the mounting portion;
    an applicator mount to retain the mounting portion of the tapered LM applicator; and
    an actuator attached to the applicator mount, the actuator to:
        compress the LM application region against a thermal surface;
        swipe the LM application region across the thermal surface in a first direction deposit a first LM layer onto the thermal surface;
        swipe the LM application region across the thermal surface in a second direction to deposit a second LM layer onto the first LM layer;
    a measurement device to:
        measure a first dispense weight of LM prior to the deposition of the LM first layer; and
        measure a second dispense weight of LM subsequent to the deposition of the second layer of the LM;
    wherein:
        the actuator is further to swipe the LM application region across the thermal surface to deposit a third LM layer onto the second LM layer in response to a determination that an insufficient amount of LM TIM has been applied based on the first dispense weight and the second dispense weight;
        the LM application region contacts only a portion of the thermal surface to reduce an adhesion between the LM application region and the thermal surface; and
        the tapered LM applicator includes an open-cell foam applicator with an associated foam porosity configured to promote absorption and diffusion of the LM TIM into the open-cell foam applicator.

2. The system of claim 1, the system further including:
    a memory; and
    processing circuitry to control the actuator to:
        compress the LM application region against the thermal surface;
        swipe the LM application region across the thermal surface in the first direction; and swipe the LM application region across the thermal surface in the second direction.

3. The system of claim 2, wherein the actuator includes:
a first single axis actuator to compress the LM application region in a first axis; and
a second single axis actuator to swipe the LM application region in a second axis perpendicular to the first axis, the second axis including the first direction and the second direction.

4. The system of claim 2, wherein:
the actuator includes a third single axis actuator to reposition the LM application region in a third axis from a first position above the thermal surface to a second position above a second thermal surface; and
the third axis is orthogonal to the first axis and to the second axis.

5. The system of claim 2, wherein the LM application region is smaller than the thermal surface to reduce surface tension between the thermal surface and the LM TIM in the LM application region, the reduced surface tension to improve an ability of the LM application region to be lifted from the thermal surface.

6. The system of claim 5, wherein the open-cell foam applicator includes an open-cell polyurethane foam applicator.

7. The system of claim 2, wherein:
the LM TIM includes an oxide;
the deposition of the first LM layer onto the thermal surface includes forming an oxide layer on the thermal surface to anchor the LM TIM to the thermal surface; and the second LM layer bonds to the oxide layer.

8. The system of claim 7, wherein:
the LM TIM includes a gallium based LM; and
the oxide layer includes gallium oxide.

9. The system of claim 2, wherein the foam porosity of the open-cell foam applicator is configured to:
absorb the TIM into the LM application region when the LM application region is submerged in the LM TIM; and
diffuse the LM TIM through the LM application region into the mounting portion.

* * * * *